United States Patent [19]

Sasaki et al.

[11] Patent Number: 5,509,026
[45] Date of Patent: Apr. 16, 1996

[54] MULTIPLE QUANTUM WELL SEMICONDUCTOR LASER

[75] Inventors: Yoshihiro Sasaki; Takao Morimoto, both of Tokyo, Japan

[73] Assignee: NEC Corporation, Tokyo, Japan

[21] Appl. No.: 384,333

[22] Filed: Feb. 1, 1995

[30] Foreign Application Priority Data

Feb. 3, 1994 [JP] Japan ..................................... 6-030830

[51] Int. Cl.⁶ ..................................................... H01S 3/19
[52] U.S. Cl. ............................................... 372/45; 372/46
[58] Field of Search .................................. 372/45, 50, 46

[56] References Cited

U.S. PATENT DOCUMENTS

| | | | |
|---|---|---|---|
| 4,823,352 | 4/1989 | Sugimoto | 372/45 |
| 5,200,969 | 4/1993 | Paoli | 372/45 |
| 5,373,521 | 12/1994 | Takahashi | 372/45 |

OTHER PUBLICATIONS

J. Shimizu et al., "Optical Confinement Factor Dependencies of the K factor, Differential Gain, and Nonlinear Gain C oefficient for 1.55 μm InGaAs/InGaAsP MQW and Strained MQW Lasers," IEEE Photonics Technology Letters, vol. 3, No. 9, 1991.

M. Nido et al., "Analysis of Differential Gain in InGaAs––InGaAsP Compressive and Tensile Strained Quantum––Well Lasers and Its Application for Estimation of High––Speed Modulation Limit," IEEE Journal of Quantum Electronics, vol. 29, No. 3, Mar. 1993, pp. 885–895.

H. Asano et al., "1.48–μm High–Power InGaAs/InGaAsP MQW LD's for Er–Doped Fiber Amplifiers," IEEE Photonics Technology Letters, vol. 3, No. 5, May 1991, pp. 415–417.

T. Namegaya et al. "High Temperature Operation of 1.3 μm GaInAsP/InP Grinsch Strained–Layer Quantum Well Lasers". Electronics Letters, vol. 29, No. 4, 18 Feb. 1993, Stevenage, Great Britian, pp. 392–393.

H. Nobuhara et al. "High–Temperature Operation of InGaAs/InGaAsP Compressive-Strained QW–Lasers with Low Threshold Currents". IEEE Photonics Technology Letters, vol. 5, No. 9, Sep. 1993, New York, United States, pp. 961–962.

H. Yamada et al. "Extremely Low Operating Current lambda=1.3 μm Multiple–Quantum–Well Laser Diodes". NEC Research & Development, vol. 33, No. 3, Jul. 1993, Tokyo, Japan, pp. 354–363.

D. Coblentz et al. "Strained Multiple Quantum Well Lasers Emitting at 1.3 μm Grown by Low–Pressure Metalorganic Vapor Phase Epitaxy". Applied Physics Letters, vol. 59, No. 4, 22 Jul. 1991, New York, United States, pp. 405–407.

C. Starck et al. "Strained Quaternary GaInAsP Quantum Well éaser Emitting at 1.5 μm Grown by Gas Source (List continued on next page.)

Primary Examiner—Rodney B. Bovernick
Assistant Examiner—Yisun Song
Attorney, Agent, or Firm—Burns, Doane, Swecker & Mathis

[57] ABSTRACT

Disclosed herein is a long wavelength multiple quantum well semiconductor laser which is capable of preventing the nonuniform injection of carriers into quantum wells, and the overflow of the electrons within the quantum wells, and which is also capable of suppressing the increase in the threshold caused by insufficient gain, and the increase in the threshold and the deterioration in the slope efficiency caused by internal absorption loss. In a multiple quantum well semiconductor laser which has an InGaAsP optical waveguide layer provided respective on the inside of a p-InP clad layer and an n-InP clad layer, and InGaAsP barrier layers and strained InGaAsP quantum well layers provided between the InP clad layers, the semiconductor laser according to this invention has the energy difference between the first quantum level of the hole in the quantum well and the top of the valence band in the barrier layer to be less than or equal to 160 meV, the energy difference between the first quantum level of the electron in the quantum well and the bottom of the conduction band in the barrier layer to be more than or equal to 30 meV, and the optical confinement factor to the quantum layer lying in the range from 0.01 to 0.07.

8 Claims, 6 Drawing Sheets

OTHER PUBLICATIONS

Molecular Beam Epitaxy". Journal of Crystal Growth, vol. 120, No. 1/4, 2 May 1992, Amsterdam, Netherlands, pp. 180–183.

J. S. Osinski et al. "Low–Threshold–Current–Density 1.5 µm Lasers Using Compressively Strained InGaAsP Quantum Wells". IEEE Photonics Technology Letters, vol. 4, No. 1, Jan. 1992, New York, United States, pp. 10–13.

MULTIPLE QUANTUM WELL SEMICONDUCTOR LASER

BACKGROUND OF THE INVENTION

1. Field of the Invention

The present invention relates to the structure of a multiple quantum well (referred to as MQW hereinafter) semiconductor laser, and more particularly to the structure of a long wavelength MQW semiconductor laser having InP as the substrate, and used as a light source for optical communication or the like.

2. Description of the Prior Art

Research and development on the semiconductor lasers employing MQW in the active layer are being pursued vigorously since they can bring about marked improvement of the laser characteristics, and numerous papers have been published in recent years.

FIG. 6(a) is a schematic perspective view of a conventional 1.48 µm band MQW semiconductor laser chip disclosed in IEEE Photonics Technology Letters, Vol. 3, pp. 415–417, 1991, and FIG. 6(b) is a band diagram of its active layer part.

In the figures, 201 is an n-InP substrate, 202 is an MQW active layer, 203 is a p-InP clad layer, 204 is a p-InP block layer, 205 is an n-InP block layer, 206 is a p-InP burying layer, 207 is a p$^+$-InGaAsP cap layer, and 208 are electrodes. This semiconductor laser has a buried structure called double-channel planar buried heterostructure (DC-PBH), and its active layer has a width of 1.6 µm. In addition, 211 is a 1.15 µm composition InGaAsP optical waveguide layer, 212 is a 1.15 µm composition InGaAsP barrier layer, 213 is an InGaAs quantum well layer, 214 is a 1.15 µm composition InGaAsP optical waveguide layer on the p side.

Here, the number of quantum well layers is set to be two to seven. FIG. 6(b) shows the 5 layer case. The thickness of the quantum well layer is 4 nm, the thickness of the barrier layer is 13 nm, and the thickness of the waveguide layer combining the quantum well layers, the barrier layers and the optical waveguide layers is 200 nm. With the above constitution, when the number of quantum well layers is changed from two to seven, the internal absorption loss changes from 5 to 10 cm$^{-1}$, but the internal differential quantum efficiency remains at a low level of 60 to 70% or so. In this example, the energy difference (referred to as δEv hereinafter) between the first quantum level of the heavy hole of the quantum well and the top of the valence band of the barrier layer is about 180 meV, and the energy difference (referred to as δEc hereinafter) between the first quantum level of the electrode of the quantum well and the bottom of the conduction band of the barrier layer is about 80 meV.

In a semiconductor laser having a structure in which carriers are injected into the quantum well layers from the direction traversing the quantum well layers and the barrier layers, it is conjectured that the internal differential quantum efficiency shows a small value because of the occurrence of a nonuniform injection of the holes when δEv has such a large value as 180 meV. Further, when the number of quantum well layers is such a small value as two, the optical confinement factor is small so that even though the internal loss may be as small as 5 cm–1, the gain also becomes low. This results in an increase in the lasing threshold when one forms a laser with short cavity resonators.

In the design of an MQW semiconductor laser, there are an extremely large number of parameters such as the quantum well composition, the lattice distortion of the quantum well, the thickness of the quantum well layer, the number of the quantum well layers and the barrier layer composition, etc. Accordingly, to optimize the quantum well structure for a certain lasing frequency, it is necessary to repeat experimenting in a trial and error fashion which gives rise to a problem that an enormous amount of labor and cost are required, and that the research and development has to be extended over a long period of time.

SUMMARY OF THE INVENTION

It is therefore an object of this invention to provide a structural condition necessary to improve the overall performance of a long wavelength MQW laser, and thereby develop an MQW semiconductor laser with excellent characteristics in a short time with less labor.

In order to attain the above object in a long wavelength MQW semiconductor laser using InP as the substrate, this invention provides an MQW semiconductor laser which is characterized in that the energy difference between the first quantum level of the hole in the quantum well and the top of the valence band in the barrier layer is smaller than or equal to 160 meV, the energy difference between the first quantum level of the electron in the quantum well and the bottom of the conduction band in the barrier layer is greater than or equal to 30 meV, and the optical confinement factor of the quantum well lies in the range from 0.01 to 0.07.

In the long wavelength MQW semiconductor laser according to this invention, the energy difference between the first quantum level of the hole in the quantum well and the top of the valence band in the barrier layer is less than or equal to 160 meV, so that it is possible to suppress the deterioration of the internal differential quantum efficiency due to nonuniform injection of the carriers that is found in a laser structure in which the carriers are injected into the quantum well layers from the direction traversing the quantum well layers and the barrier layers.

Moreover, since the energy difference δEc between the first quantum level of the electron in the quantum well and the bottom of the conduction band in the barrier layer is more than or equal to 30 meV, it is possible to suppress the overflow of the electrons into the barrier layer, and suppress the increase of the internal absorption loss.

Furthermore, since the optical confinement factor to the quantum well layer in this invention is arranged to lie in the range from 0.01 to 0.07, it is possible to suppress the increase of the threshold caused by insufficient gain, and restrain the increase in the threshold and the deterioration of the slope efficiency caused by the internal absorption loss.

BRIEF DESCRIPTION OF THE DRAWINGS

The above and other objects, features and advantages of this invention will become more apparent with reference to the following detailed description taken in conjunction with the accompanying drawings, wherein.

DETAILED DESCRIPTION OF THE PREFERRED EMBODIMENTS

Figure 1:
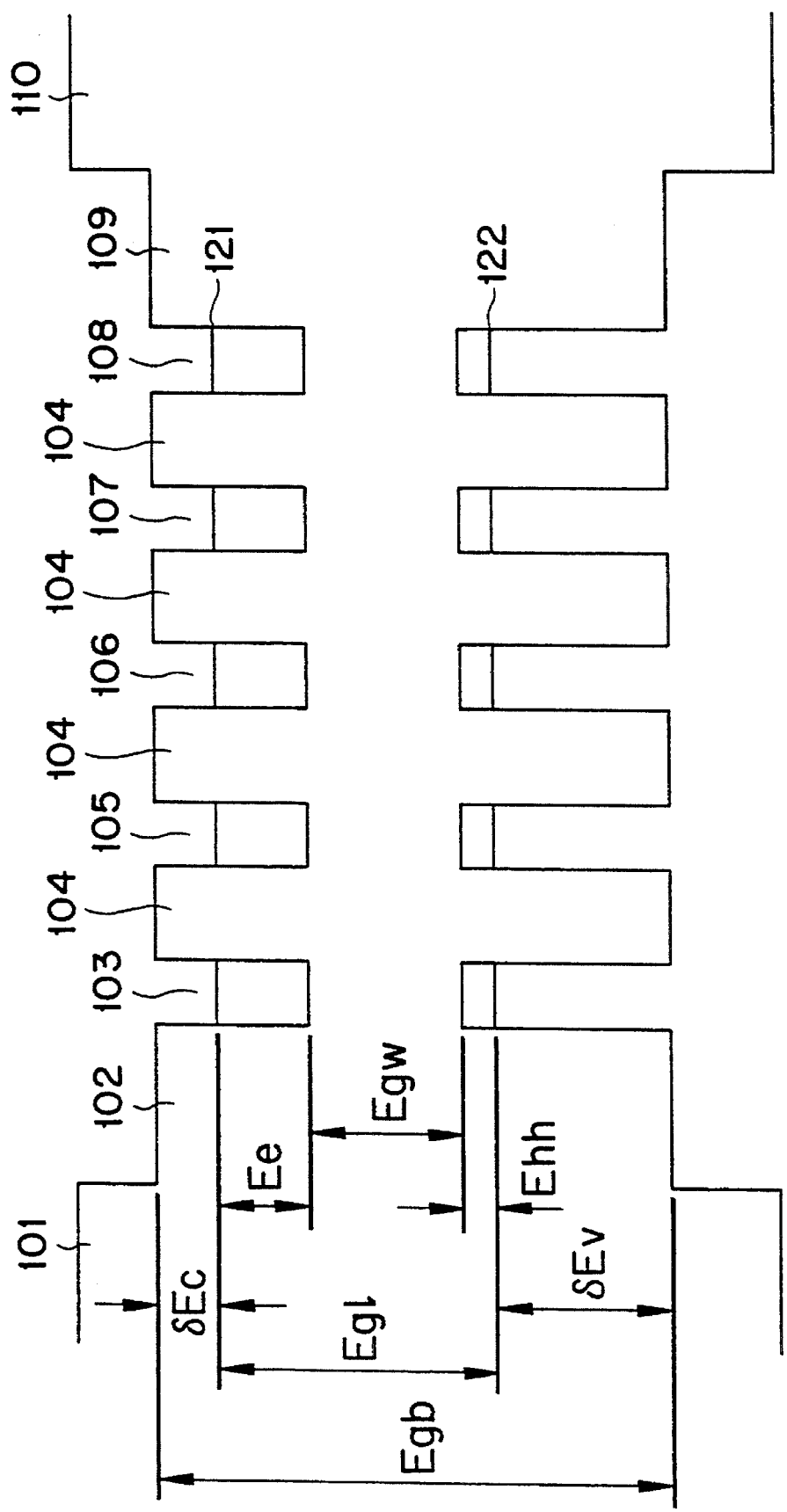
FIG. 1 is an energy band diagram of the active layer region of a semiconductor laser according to the first embodiment of the invention.

Next referring to the drawings, the embodiments of this invention will be described.

FIG. 1 is a band structure diagram in the active layer of a 1.55 μm band MQW semiconductor laser which is the first embodiment of this invention. In the figure, 101 is a p-InP clad layer, 102 and 109 are 1.13 μm composition InGaAsP optical waveguide layers, 104 are 1.2 μm composition InGaAsP barrier layers, 103, 105, 106, 107 and 108 are 1.7 μmm composition strained InGaAsP quantum well layers as counted from the p side, 110 is an n-InP clad layer, 121 is the first quantum level of the electron and 122 is the first quantum level of the hole. Further, in the figure, Egb is the band gap energy of the barrier layer, Egw is the band gap energy of the quantum well layer, Egl is the energy converted value of the lasing wavelength, Ee is the quantization energy of the first quantum level of the electron, Ehh is the quantization energy of the first quantum level of the hole, δEc is the energy difference between the first quantum level of the electron and the bottom of the conduction band of the barrier layer, and δEv is the energy difference between the first quantum level of the hole and the top of the valence band of the barrier layer.

Figure 6A:
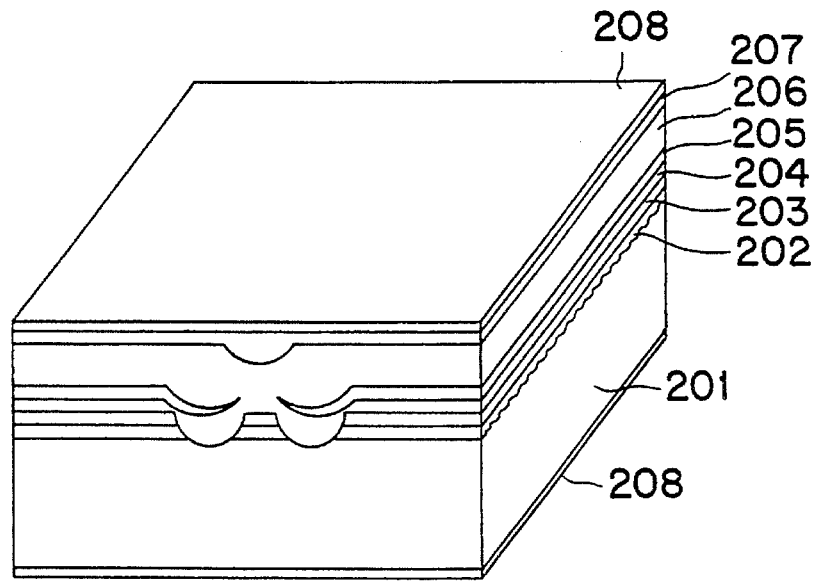
FIG. 6(a) is a schematic perspective view of a conventional 1.48 μm and MQW semiconductor laser according to the prior art.
Figure 6B:
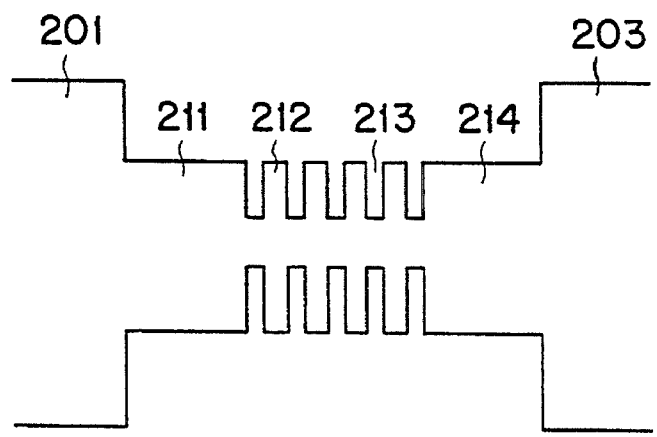
FIG. 6(b) is an energy band diagram of the active layer region of a conventional 1.48 μm band MQW semiconductor laser according to the prior art.

The number of the quantum wells was set to be five in this embodiment. As the method for forming extremely thin semiconductor layers such as the quantum well layers and the barrier layers, metal-organic chemical vapor deposition (MOCVD) method was employed. Following that, a semiconductor laser having a DC-PBH type buried structure as shown in FIG. 6(a) was formed by employing, for example, photolithography and liquid phase epitaxial growth method.

In this embodiment, δEv, δEc and the optical confinement factor to the quantum well layer are 147.6 meV, 63.1 meV and 0.013, respectively.

Referring to the drawings, the operating principles of the invention will be described in detail in what follows. First of all, it is to be noted here that the first quantum levels 121 and 122 of the electron and the hole, respectively, can be determined arbitrarily by the choice of the quantum well layer composition, the quantum well layer thickness and the barrier layer composition, and as a result, the lasing wavelength can also be matched to a desired wavelength.

Now, there has been pointed out that the higher barrier layer height of the quantum well is preferred since a larger barrier layer height against the hole has such merits as a larger differential gain, a larger relaxation oscillation frequency and the like (IEEE Journal of Quantum Electronics, Vol. 29, pp. 885–895, 1993).

Figure 3:
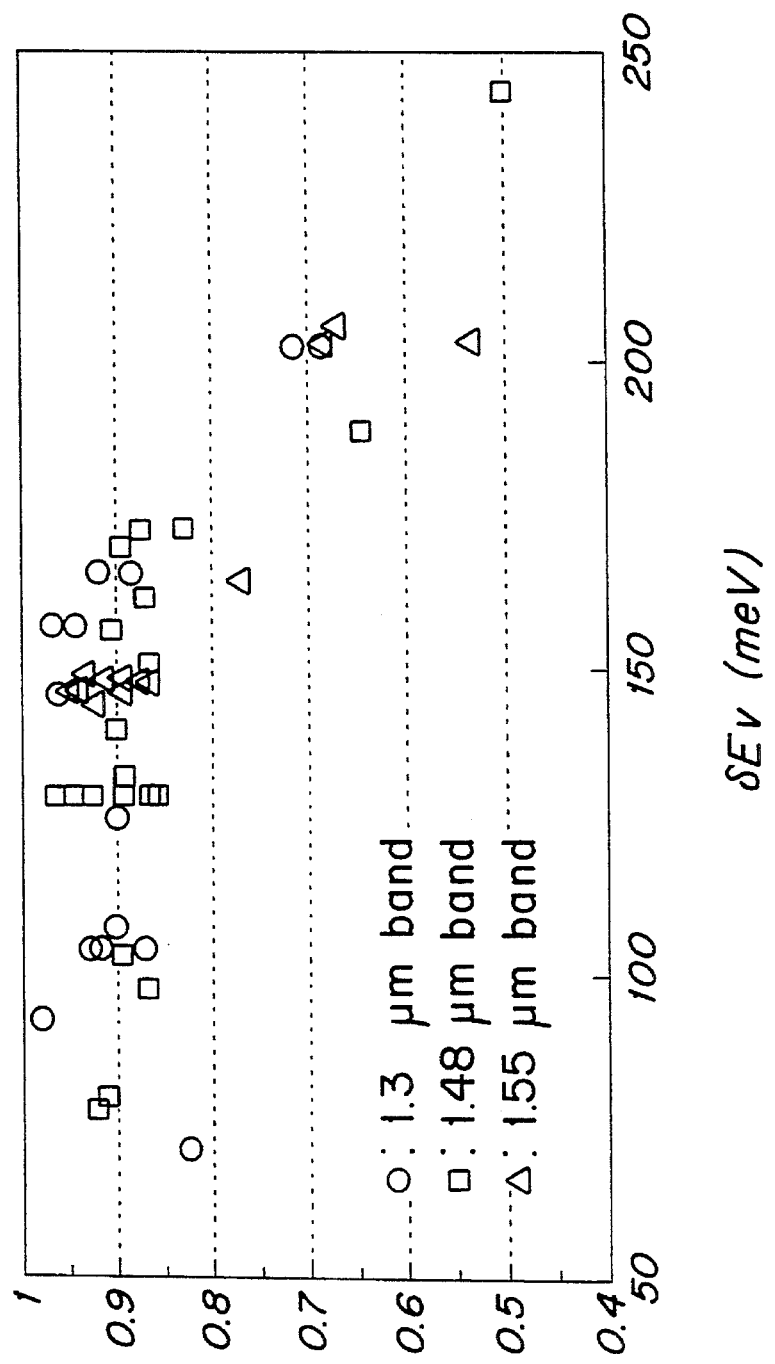
FIG. 3 is a graph plotting the correlation between δEv and the internal differential quantum efficiency of a Fabry-Perot type MQW semiconductor lasers.

However, when the structure of the laser is such that the carriers are injected into the quantum well layers from the direction traversing the quantum well layers and the barrier layers, an increase in the height of the barrier layer has a demerit in that δEv is inevitably increased and the internal differential quantum efficiency is lowered. FIG. 3 is a graph plotting the correlation between δEv and the internal differential quantum efficiency by taking them on the abscissa and ordinate, respectively. The samples used are Fabry-Perot lasers of 1.3 μm band (○ mark), 1.48 μm band (□ mark) and 1.55 μm band (Δ mark) (the same marks used in FIG. 4 and FIG. 5 that follow represent the same wavelengths as in this figure).

It can be seen that regardless of the lasing wavelength band the internal differential quantum efficiency drops sharply in the region where δEv exceeds 160 meV. This is considered to be due to the fact that as δEv gets large, once the holes, which have high effective masses, are injected into the quantum layers 103 and 105 nearer, the p side, it becomes difficult for them to get out of the quantum layers, and this decreases the number of holes that are injected into the quantum layers 107 and 108 on the n side, resulting in a state of nonuniform injection. This effect becomes conspicuous when the number of the quantum layers becomes large. According to this invention, it is possible to restrain the deterioration of the internal differential quantum efficiency, and hence it is possible to suppress the fall of the slope efficiency which is an important characteristic of the semiconductor laser.

Figure 4:
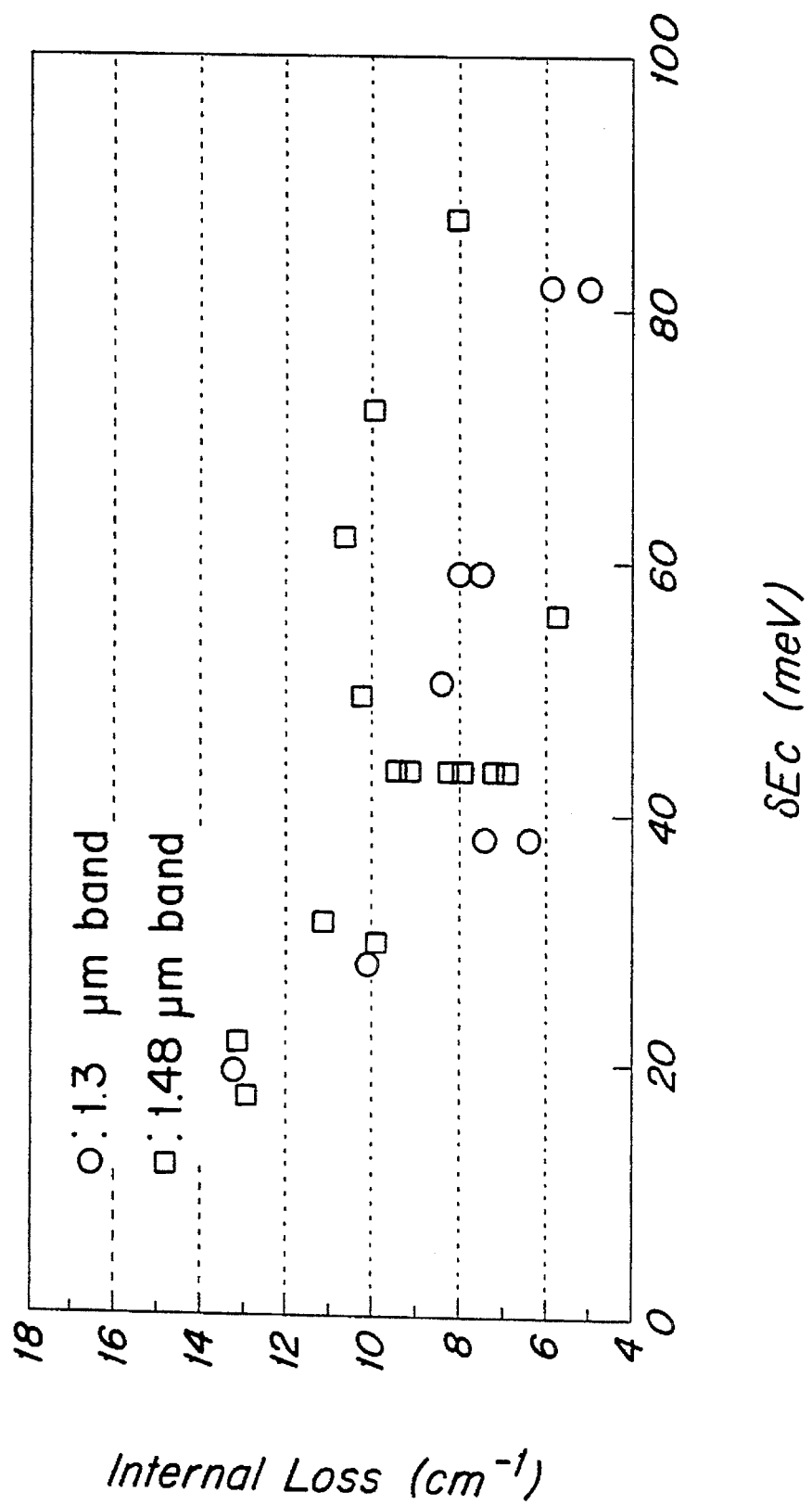
FIG. 4 is a graph plotting the correlation between δEc and the internal absorption loss $α_i$ of the Fabry-Perot type MQW semiconductor lasers.

On the other hand, the thickness of the quantum well layer is desirable to be small since the smaller the thickness, the more marked the quantum effect is and hence higher the gain. However, as the thickness of the quantum well layer is decreased, δEc becomes small and the electrons overflow out of the quantum well and are distributed over the optical waveguide layers or the barrier layers, so that the loss in the optical waveguide layers and the barrier layers becomes large thus increasing the internal absorption loss. In FIG. 4 is shown the correlation between δEc and the internal absorption loss $α_i$ of the MQW Fabry-Perot semiconductor lasers. Here, the number of the quantum well layers is five for all samples. It is clear that the internal absorption loss is increased when δEc is less than 30 meV. Since δEc is set to be higher than or equal to 30 meV in this invention, it is possible to hinder the increase in the internal absorption loss and prevent the threshold current, which is one of the important characteristics of the semiconductor laser, from being increased.

Further, in the MQW semiconductor laser, the gain and the internal absorption loss are proportional to the optical confinement factor to the quantum well layer. When the gain is small, the threshold is increased because more carriers are needed for lasing oscillation. On the other hand, even if the gain is large, when the internal absorption loss is large, there is still some gain needed to overcome the internal absorption loss, which causes increase in the threshold and deteriorates the slope efficiency. Accordingly, there exists an optimum range of the optical confinement factor in order to make low threshold and high slope efficiency compatible.

Figure 5:
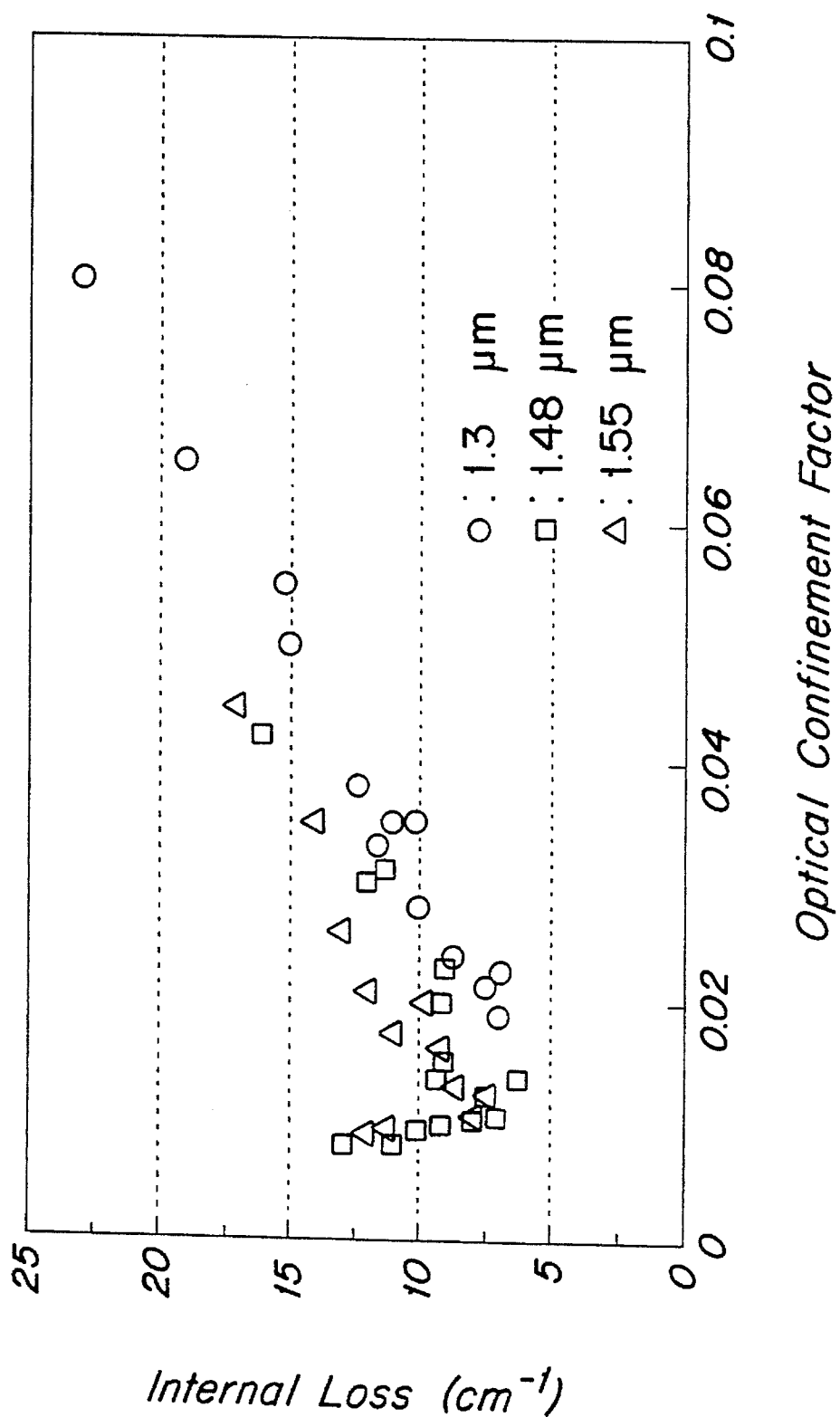
FIG. 5 is a graph showing the dependence of the internal absorption loss $α_i$ on the optical confinement factor for samples with substantially equal δEv and δEc.

FIG. 5 is a graph showing the dependence of the internal absorption loss on the optical confinement factor for samples with substantially equal parameters such as δEv and δEc. The internal absorption loss increases with the increase of the optical confinement factor. However, as the optical confinement factor becomes smaller than 0.01 the internal absorption loss is suddenly increased for all wavelengths. Since the gain is also decreased further in the range where the optical confinement factor is less than 0.01, the increase the threshold becomes more intense. In this invention the increase in the internal absorption loss is restrained and the increase in the threshold is suppressed.

Moreover, since the internal absorption loss of the InGaAsP bulk active layer of the 1.55 μm band, where the internal absorption loss is the highest, lies in the range from 20 to 30 $cm^{-1}$, it is necessary to have the internal absorption loss less than 20 $cm^{-1}$ in order to appreciate the effect of application of the quantum layers. For this reason, the optical confinement factor is set to be smaller than 0.07 in this invention.

Since, in the first embodiment δEv is set at a small value of 147.6 meV, as shown in FIG. 3, it lies outside the range which gives rise to an adverse effect of the nonuniform injection of the carriers, and the internal differential quantum efficiency attains a high value of 88%. In contrast to the case of the conventional MQW semiconductor laser of lasing wavelength 1.55 μm using InGaAs for the quantum well layers and 1.13 μm composition InGaAsP for the barrier layers, where δEv is about 200 meV, and as a result, the internal differential quantum efficiency is about 67%, the result of this embodiment can be said to be representing a remarkable improvement.

Moreover, since Ec was set to 63 meV and the optical confinement factor was given a small value of 0.013, it was possible to suppress the internal absorption loss to a low value of 8.7 $cm^{-1}$, unlike 10 $cm^{-1}$ in the conventional case.

A measurement of the pulse height-output characteristic using the first embodiment in which the cavity length is 900 μm and 6–90% AR coating and HR coatings are given on the facets, produced a light output of 340 mW for the drive current of 1 A. This represents a light output of about 1.9 times as high as the conventional value.

Moreover, this embodiment employs a DC-PBH so that a pnpn thyristor formed in the current blocking structure will not be turned on even in the state of high current injection, and a satisfactory high output characteristic can be obtained.

Figure 2:
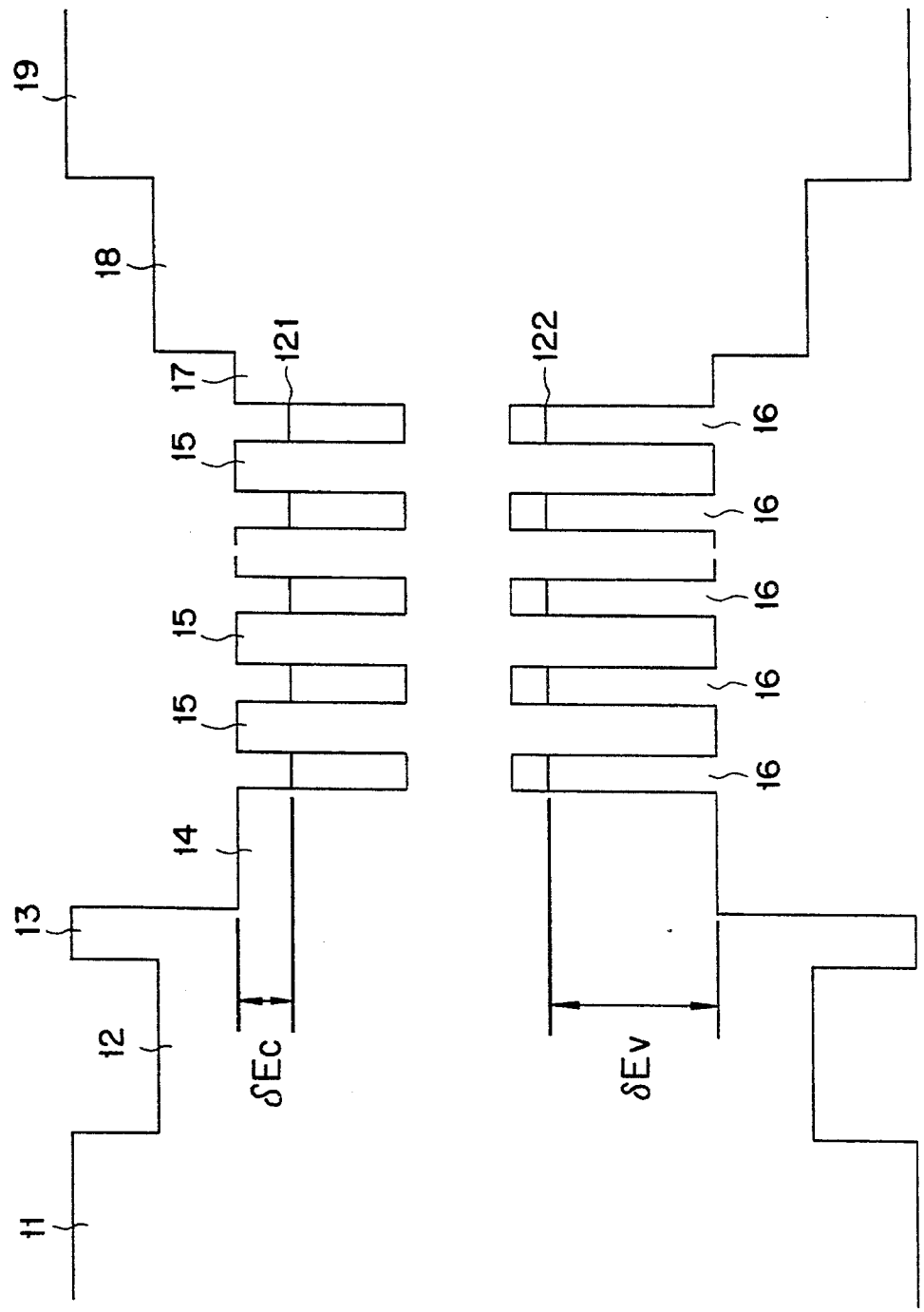
FIG. 2 is an energy band diagram of the active layer region of a semiconductor laser according to the second embodiment of the invention.

Next, the second embodiment of this invention will be described. FIG. 2 is a band structure diagram of the active layer region of a 1.3 μm band-MQW distributed feedback type semiconductor laser according to this embodiment. In the figure, 11 is an InP substrate, and 12 is a 1.05 μm composition InGaAsP optical waveguide layer. Diffraction gratings are formed on the substrate 11, and are buried with the InGaAsP optical waveguide layer 12. Reference numeral 13 is an n-InP spacer layer, 14 and 17 are 1.13 μm composition InGaAsP optical waveguide layers, 15 is a 1.13 μm composition InGaAsP barrier layer, 16 is a 1.42 μm composition strained InGaAsP quantum well layer, 18 is a 1.05 μm composition InGaAsP optical waveguide layer and 19 is a p-InP clad layer.

The height and the pitch of the diffraction gratings are 25 nm and 202.7 nm, respectively. The thickness of each layer is as follows. The thicknesses of the 1.05 μm composition InGaAsP optical waveguide layers on the n side (12) and on the p side (18) are 40 and 50 nm, respectively, those of the 1.13 μm composition InGaAsP optical waveguide layers on the n side (14) and on the p side (17) are 20 and 10 nm, respectively, and that of the 1.13 μm composition InGaAsP barrier layer 15 is 5 nm, that of the 1.42 μm composition strained InGaAsP quantum well layer 16 is 4.2 nm and that of the p-InP clad layer 19 is 0.7 μm. The number of the quantum well layers was set to be 12. In this embodiment, interference exposure method and wet etching were employed in the formation of the gratings. The formation method of the MQW structure and the buried structure for this embodiment are the same as in the first embodiment.

In this embodiment, the values of δEv and δEc were 110 and 40 meV, respectively, and the optical confinement factor was 0.066%.

In this embodiment, the internal differential quantum efficiency is excellent in spite of the large number 12 of the quantum well layers because of the small δEv value, 110 meV. Moreover, overflow of the electrons into the barrier layers is suppressed and an unwanted increase in the internal absorption loss is restrained because of the value of 40 meV for δEc. Furthermore, an increase in the threshold did not take place in spite of the large value 0.066 of the optical confinement coefficient because of an extremely large value of the gain.

When the resonator is formed to have a length of 300 μm, and AR coating and HR coating of 1%–70% are given to the facets, in this embodiment, the threshold at 25° C. was a small value of 11 mA, and it was possible to suppress the threshold to an extremely small value of 29 mA even at 85° C. Since a DC-PBH structure is also employed in the second embodiment, it is possible to keep the potential difference of the p-n junction of the pnpn current blocking layer at a large value even at high temperatures, and therefore it is considered that an excellent high temperature characteristics is obtained.

Although the preferred embodiments have been described in the above, this invention is not limited to these embodiments, and various modifications of the disclosed embodiments are possible within the true scope of the invention. Furthermore, the embodiments have been described in conjunction with Fabry-Perot lasers and uniformly diffraction grated distributed feedback type semiconductor lasers, but the invention is also applicable to single axis mode lasers such as λ/4 shift distributed feedback lasers and distributed Bragg reflector lasers.

As has been described in the above, the MQW semiconductor laser according to this invention has the energy difference δEv between the first quantum level of the hole in the quantum well and the top of the valence band in the barrier layer to be less than or equal to 160 meV, the energy difference δEc between the first quantum level of the electron in the quantum well and the bottom of the conduction band in the barrier layer to be greater than or equal to 30 meV, and the optical confinement factor to the quantum well layer to be in the range from 0.01 to 0.07. Therefore, it is possible to suppress the degradation in the internal differential quantum efficiency due to nonuniform injection of the carriers which is generated in a laser having structures in which the carriers are injected into the quantum well layers from the laminar growth direction of the quantum well layers and the barrier layers, and it is possible to suppress the increase of the internal absorption loss by restraining the overflow of the electrons into the barrier layers. Furthermore, it is possible to suppress the increase in the threshold caused by the insufficient gain, and suppress the increase in the threshold and the deterioration in the slope efficiency caused by the internal absorption loss.

In this way, according to this invention it is possible to develop a long wavelength MQW semiconductor laser having a low threshold and comprehensively enhanced characteristics such as the internal differential quantum efficiency and slope efficiency, with less labor and in a short time by designing the device so as to satisfy the conditions mentioned in the above.

What is claimed is:

1. A multiple quantum well semiconductor laser using InP as a substrate, said multiple quantum well structure having;
an energy difference between the first quantum level of the hole in a quantum well layer and the top of the valence band in a barrier layer smaller than or equal to 160 meV,
an energy difference between the first quantum level of the electron in said quantum well layer and the bottom of the conduction band in said barrier layer larger than or equal to 30 meV, and
an optical confinement factor of said quantum well layer in the range from 0.01 to 0.07.

2. The multiple quantum well semiconductor laser as claimed in claim 1, wherein said quantum well layers are composed of strained InGaAsP material.

3. The multiple quantum well semiconductor laser as claimed in claim 1, wherein said laser is of the refractive index waveguide type having a current blocking layer and the carriers are injected into said quantum well layers from the direction traversing the quantum well layers and the barrier layers.

4. The multiple quantum well semiconductor laser as claimed in claim 1, wherein an active layer is formed in mesa stripe form on a first conductivity type InP substrate and the top surface and the side faces of said active layer are surrounded by a second conductivity type InP layer.

5. The multiple quantum well semiconductor laser as claimed in claim 1, wherein wavelength selection means is formed along a cavity direction.

6. The multiple quantum well semiconductor laser as claimed in claim 3, wherein said quantum well layers are composed of strained InGaAsP material.

7. The multiple quantum well semiconductor laser as claimed in claim 4, wherein said quantum well layers are composed of strained InGaAsP material.

8. The multiple quantum well semiconductor laser as claimed in claim 5, wherein said quantum well layers are composed of strained InGaAsP material.

* * * * *